United States Patent [19]

Carle et al.

[11] Patent Number: 4,705,591
[45] Date of Patent: Nov. 10, 1987

[54] PULLING PROCESSES AND EQUIPMENT FOR GROWING SILICON CRYSTALS HAVING HIGH AND CONTROLLED CARBON CONTENT

[75] Inventors: Jean-Francois Carle, Saint Cheron; Patrick Phillippot, Vigneux, both of France

[73] Assignee: International Business Machines Corporation, Armonk, N.Y.

[21] Appl. No.: 806,150

[22] Filed: Dec. 6, 1985

[30] Foreign Application Priority Data

Dec. 28, 1984 [EP] European Pat. Off. ........ 84430048.3

[51] Int. Cl.$^4$ ..................... C30B 15/14; C30B 15/20
[52] U.S. Cl. ............................. 156/617 SP; 156/606; 156/DIG. 89; 148/DIG. 41
[58] Field of Search ......... 156/601, 605, 606, 617 SP, 156/DIG. 88, DIG. 89; 148/DIG. 41; 422/248, 249

[56] References Cited

U.S. PATENT DOCUMENTS

| | | | |
|---|---|---|---|
| 4,400,232 | 8/1983 | Ownby et al. | 156/601 |
| 4,415,401 | 11/1983 | Wald et al. | 156/DIG. 89 |
| 4,443,411 | 4/1984 | Kalejs | 422/246 |
| 4,591,409 | 5/1986 | Ziem et al. | 156/617 SP |

FOREIGN PATENT DOCUMENTS 59-18191  1/1984  Japan .

OTHER PUBLICATIONS

Ahlgren et al, "Increasing Carbon Content in Czochralski Grown Crystals", IBM-TDB, vol. 25, No. 3A, Aug. 1982, pp. 962–963.
Endo et al, "Equilibrium of Carbon and Oxygen in Silicon and Carbon Monoxide in Ambient Atmosphere", Journal of Electrochemical Society, Aug. 1979, vol. 126, No. 8, pp. 1422–1425.

*Primary Examiner*—Gary P. Straub
*Attorney, Agent, or Firm*—Steven J. Meyers

[57] ABSTRACT

Silicon crystals with high and controlled predictable carbon content can be grown by controlling oxygen introduced into the pulling chamber during the melting in standard Czochralski silicon crystal pullers.

Carbon concentration profile of grown crystals can be deduced from the carbon monoxide [CO] concentration real time monitoring, through its integral taken during the whole pulling duration. This process is reproducible, and the carbon content in the silicon is consistent. Means to practice this method are also disclosed.

2 Claims, 16 Drawing Figures

PRIOR ART

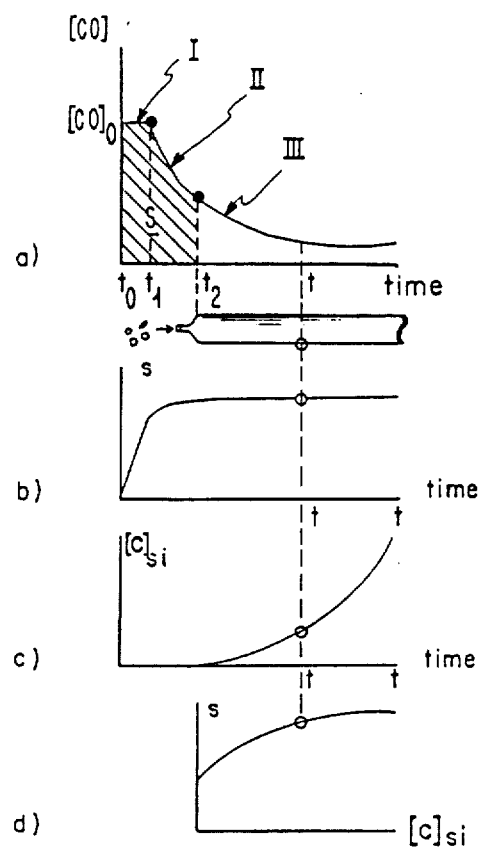
FIG. 3
FIG. 4
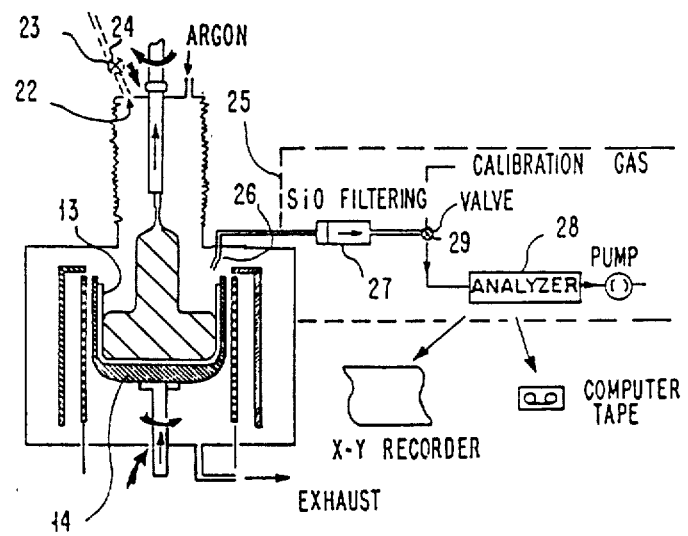

PULLING PROCESSES AND EQUIPMENT FOR GROWING SILICON CRYSTALS HAVING HIGH AND CONTROLLED CARBON CONTENT

BACKGROUND OF THE INVENTION

1. Field of Invention

The present invention relates to the growth of silicon crystals according to the Czochralski method, and more particularly to improvements to pulling processes and related equipment for growing silicon crystals having high and controlled carbon content.

2. Background Art

The present trend im microelectronics towards highly integrated ssemiconductor devices requires more and more a good knowledge of the crystalline structure of the substrates used. In general, these substrates result from the slicing of monocrystalline silicon cyrstals obtained from the Czochralski pulling technique.

It is generally known that the presence of oxygen atoms in the silicon substrate is benefical. These atoms incorporated into the crystal during the pulling process tend to diffuse during high temperature processing and to cluster, providing both valuable hardening and gettering effects. Hardening is a mechanical strength enhancement due to the fact that oxygen precipitates impede dislocations and slips. Gettering is due to high microstresses at the viciniity of oxygen precipitates, which allow the capture of fast diffusing impurities, mainlly metallic impurities. U.S. Pat. No. 4,220,483, assigned to the same assignee as of the present invention, describes in detail the gettering phenomemon.

Recently, it has been demonstrated that carbon atoms, also incorporated in silicon crystals during the crystal growth, can play a significant role in the oxygen precipitation kinetics as well, when the substrates are submitted to subsequent thermal treatments. The carbon incorporation in silicon crystals is assumed to occur from carbon monoxide (CO) absorption by the melt. Since the carbon vapor pressure is extremely low, once a CO molecule is trapped by the melt, carbon will stay and become incorporated later on into solid silicon according to the freezing segregation coefficient.

FIG. 1 shows a schematic cut view of conventional prior art crystal puller equipment of the atmospheric pressure type. A monocrystalline rod-shaped silicon crystal 11 is grown from a silicon melt 12 contained in a quartz liner 13. The crucible 14 consists of a rotating graphite holder, surrounded by an electric resistor 15. Other heating means may be used. The seed 17 is affixed on a rotating mandrel 18. The pulling device, per se, is enclosed in a chamber 19, which is continuously filled with a neutral gas such as argon. Seals 20 and 21 are necessary at crystal and crucible rotation shaft apertures to prevent leakage. In addition, the inside pressure is slightly above atmospheric pressure to avoid contamination.

Thermochemical reactions that are likely to occur in pullers, to produce CO, are understood to be as follows: reactions between silica crucible and graphite holder:

$$C_s + SiO2_s \rightleftharpoons SiO_g + CO_g \quad (1)$$

$$3C_s + SiO2_s \rightleftharpoons SiC_s + 2CO_g \quad (2)$$

reactions between SiO and graphite:

$$SiO_g + 2C_s \rightleftharpoons SiC_s + CO_g \quad (3)$$

reactions between graphite and oxygen:

$$C_s + O2_g \rightarrow CO/1 1_2_g \quad (4)$$

$$C_s + CO2_g \rightleftharpoons 2CO_g \quad (5)$$

The subscripts s, l, g denote solid, liquid and gaseous phases respectively.

It is to be understood that uncontrolled CO generation may give rise to silicon carbide production via reaction:

$$2Si_{s\ or\ l} + CO_g \rightleftharpoons SiC_s + SiO_g \quad (6)$$

Solid silicon carbide particles, if produced by reaction between the silicon melt and the carbon monoxide over the melt, can be driven by melt flow towards the freezing interface. Due to the presence of these defect particles, an interface breakdown occurs and is followed by the formation of polycrystalline grains. In such a case, also called structure loss, the crystal has to be remelted to be pulled again in good condition. Should such a rework operation not be possible, the crystal would have to be considered a reject for integrated circuit manufacturing purposes.

For background literature on this topic, reference is made to an article by F. Schmid et al., J. Electrochem. Soc. 126.6 (1979). There has been a view in the art as taught, for example, in the IBM Technical Disclosure Bulletin, Vol. 25, No. 4, Sept. 1982, pages 1905–1906 in an article entitled "Low Carbon Czochralski Crystal Growth" by R. C. Guggenheim et al., that carbon is an undesirable impurity, and care should be exercised to reduce, as much as possible, the carbon content in the grown silicon crystals.

However, now there is a strong tendency to consider that carbon atoms are beneficial to the gettering phenomenon, in cooperation with oxygen atoms. A good example of that approach may be found in European Patent application No. 84109528.4, entitled "Silicon Wafer and its Application in Producing Integrated Circuit Devices", by D. C. Ahlgren et al., and assigned to the same assignee as of the present invention. Disclosed in this patent application is a silicon wafer material, having a high carbon concentration in the range between 0.5 ppma and the solid solubility limit of carbon in silicon, and a low oxygen concentration in the range between about 15 ppma and 28 ppma. The wafer is capable of providing improved integrated circuit devices with significantly improved yields, due to large defect-free zones having a high quality crystal lattice formed therein during device fabrication.

Another aspect disclosed in Ahlgren et al. is a manufacturing process of sorting the wafers formed from a melt-grown silicon crystal, by characterizing the wafers. The process is comprised of: measuring the concentrations of carbon and silicon therein and grouping the wafers into classes in accordance with their oxygen and carbon concentrations. The wafers having high carbon and low oxygen concentrations are further processed through a device production line for obtaining high yield and high quality integrated circuit devices. According to the teachings of Ahlgren et al., once the silicon crystal rod has been pulled, the wafers are obtained from dicing the rod as standard, then characterized and individually sorted by measuring their concentration of carbon. It may happen, that only a small portion of the rod has the desired carbon concentration, resulting in a waste of costly wafers. In addition, the suggested technique is complex and long. However, this application has the advantage of clearly emphasizing the key role of carbon on the final product yields. As it may be understood from Table I of Ahlgren et al., with wafers having the same oxygen concentration, (e.g. 31 ppmA), the percentage of wafers having a leakage current of less than 20 pA raises from 23% to an astonishing 73% when the carbon content slightly raises from about 1 to 3 ppmA.

The principle of introducing small amounts of carbon to Czochralski-grown silicon crystals is known, as described in the IBM Technical Disclosure Bulletin, Vol 25, No. 3A, August 1982, pages 962-963, an article entitled "Increasing Carbon Content in Czochralski Grown Crystals" by D. C. Ahlgren et al. In that TDB no means is suggested on how to obtain controlled and reproducible carbon content. The secondary effects of introducing oxygen into the chamber on the oxygen content in the silicon crystal are not analyzed. Lastly, according to that process, there is no indication on the actual amount of carbon introduced in the silicon crystal. In other words there is no control of carbon incorporation in the silicon crystal.

Japanese Patent No. 59-18191 by Shigeo Enoki, owned by Shinetsu Handoutai K. K., teaches a method of reacting a carbon containing gas with polycrystalline raw material during melting. Particularly, it is shown that a fixed amount of CO gas is introduced at the top of the furnace (i.e., chamber) and is reacted with the silicon melt. However, there are numerous problems associated with this method.

The Enoki patent does not teach a method or means for obtaining predictable, reproducible carbon content in silicon crystals. The method disclosed does not provide for real time in-situ control that changes as the kinetics of the process change, but merely provides for volumetric control of a carbon containing gas. No predictable and reproducible correlation is made between the amount of carbon containing gas introduced and the ultimate carbon content in the silicon crystal in part because there is no real time in situ control and in part because of the kinetics, wherein not all of the CO present in the puller atmosphere is trapped by the melt, but only the fraction over the melt surface. This fraction depends on gas vortices. The gas vortex itself is a function of thermal distribution depending on heating and packaging geometry. Since it is not possible to exactly duplicate the geometry and consequently the vortex run after run on the same puller or from one puller to another, a wide spread of carbon content in the melt would be expected. In addition, any excess carbon introduced into the chamber during the method becomes an unwanted dopant. Due to the presence of this unwanted dopant, the flow rate of the carbon containing gas introduced into the chamber would have to be recalibrated routinely. Applicants have in fact experimented with introducing carbon containing gases into the chamber atmosphere. Specifically, methane was introduced, and the resultant process had no control over the final content of carbon in the crystal. It is believed that the equilibrium kinetics between the carbon introduced from the outside and the carbon preexisting in the chamber was erratic.

In addition, very low yields resulted when methane was introduced because the monocrystalline structure of the silicon was destroyed. This can be explained by the fact that adding excess carbon into the chamber atmosphere increases the partial pressure of carbon gas in the chamber, causing the formation of excess silicon carbide. When silicon carbide gets into the melt, it causes defects in the crystal lattice, thus making the resultant crystal polycrystalline. The excess silicon carbide also adheres to parts inside the chamber, resulting in increased maintenance time required to clean silicon carbide from the chamber and parts therein.

Thus, the major drawbacks of utilizing Enoki to control carbon content in silicon are that there is no in-situ control apparatus or method disclosed which during the pulling process would be able to consistently predict the ultimate carbon content in a crystal; the kinetics are hard to control when carbon from outside the puller reacts with carbon preexisting therein; and low yields and increased maintenance requirements due to excess silicon carbide that is formed.

In a recent publication, Y. Endo et al (J. Electrochem. Soc. 126.8.1979) proposed a combined oxygen-carbon control in silicon crystals by means of CO monitoring during crystal pulling.

They assumed reactions (1) and (6) to occur, and an added reaction:

$$CO_g + SiO_g \rightleftharpoons SiO_g + C \tag{7}$$

They also defined an apparent equilibrium constant K.

$$K = \frac{[CO]}{[C]_{si} \times [O]_{si}}$$

$[C]_{si}$ and $[O/11]_{si}$ being oxygen and carbon content in the silicon crystal at a location in the crystal rod corresponding to the time the carbon monoxide concentration was measured. Without any theoretical justification, K was found to be close to the equilibrium constant of reaction:

$$C_{si} + O_{si} \rightleftharpoons CO_g \tag{8}$$

derived from different experiments and computations. Experiments carried out by the inventors of the present invention, using Endo et al approach, concluded that no relationship could be established between carbon monoxide concentration [CO], measured during crystal pulling, and the corresponding product of the carbon content and oxygen concentration in silicon, $[C]_{si} \times [O]_{si}$, for well defined locations in crystal rod, although [CO] values are in the same range of 10 to 50 ppmA observed by Endo et al. This is demonstrated in FIGS. 2A to 2E. In addition to that, no correlation could be made between oxygen present in a molecular state in the puller atmosphere, given by the oxygen concentration (O2), and oxygen concentration in silicon: $[O]_{si}$ (see FIG. 2F).

We can explain the failure of the Endo approach by the fact that carbon and oxygen are incorporated into a silicon crystal through completely separate independent mechanisms. It is generally admitted that oxygen incorporation in silicon results from silicon crucible dissolution in the silicon melt via reactions:

$$SiO_{2s} \rightleftharpoons Si_l + 2\{O\} \qquad (9)$$

where $\{O\}$ denotes dissolved oxygen in the silicon melt. Part of this oxygen is incorporated into the growing solid, while the most important fraction leaves the melt under SiO form via reactions:

$$\{O\} \rightleftharpoons \tfrac{1}{2}O_{2g} \qquad (10)$$

$$Si_l + \tfrac{1}{2}O_{2g} \rightarrow SiO_g \qquad (11)$$

So, clearly, no relationship can be established between carbon generation (reactions (1) to (5)) and oxygen generation (reactions (9) to (11)), especially in the case where reactions (4) and (5) dominate. Consequently, a simple [CO] recording during the crystal pulling cannot be used to monitor carbon and oxygen concentrations in crystals on a real time basis.

OBJECTS OF THE INVENTION

It is a first object of the invention to provide improvements to pulling processes and equipment for producing high carbon content silicon crystals, having predictable, controlled and reproducible characteristics.

It is another object of the invention to provide improvements to pulling processes for producing high carbon content silicon crystals, based on an oxygen partial-pressure enhancement, achieved only during the melting in order to avoid formation of polycrystalline silicon grains at the melt interface.

It is another object of the invention to provide improvements to pulling processes and equipment for producing high carbon content silicon crystals, to render them fully operable in a manufacturing environment and, in addition, to be compatible with all known processes and equipment for growing silicon crystals with controlled oxygen characteristics.

It is another object of this invention to provide improvements to pulling processes and equipment for controlling the predictable carbon content in silicon crystals continuously during in-situ processing.

It is another object of this invention to provide improvements to pulling processes and equipment so that silicon carbide buildup in the puller chamber is minimized.

It is still another object of the invention to provide improvements to pulling equipment for producing high carbon content silicon crystals, which only requires minor design changes to the puller.

SUMMARY OF THE INVENTION

Desired and reproducible amounts of carbon in the silicon crystal may be obtained through the monitoring of the concentration of carbon monoxide in the atmosphere inside the chamber of a crystal puller. The surface area under a curve which has carbon monoxide concentration plotted along the ordinate (y-axis) and time plotted along the abscissa (x-axis) S, as shown in FIG. 3 is equal to the integral of the carbon monoxide concentration taken over a period of time.

$$S = \int_o^t [CO] dt$$

By utilizing either this integral, S, or surface area under the curve shown in FIG. 3, S, both which will hereinafter be referred to as surface area S for simplicity, the carbon content in silicon may be determined and controlled as follows. Carbon monoxide concentration [CO] in the puller atmosphere is continuously recorded during crystal pulling. A good correlation exists between surface area S and carbon content in silicon.

A controlled amount of oxygen is introduced in the puller only during the melting, and will react with the carbon (graphite) pieces of the puller equipment.

In a preferred embodiment, the seals at the rotating shaft apertures are removed and the oxygen partial pressure is enhanced during a short and controlled time by creating a pressure depression. This depression may be indirectly caused by different argon flow settings to control air or oxygen leakage from the ambient. The depression controls oxygen leakage because as argon is introduced into the chamber, argon also leaks out. As the argon leaks out, a localized pressure depression causes backstreaming in the areas of the controlled air or oxygen leak. High carbon content crystals can be produced very simply this way.

Finally, reaction between oxygen and the carbon parts may be enhanced by a special design of a graphite crucible holder, with respect to the quartz crucible, in order to expose a greater area of the graphite crucible holder to the puller atmosphere.

The foregoing and other objects, features, and advantages of the invention will be apparent from the following more particular description of a preferred embodiment of the invention, as illustrated in the accompanying drawings, forming a material part of the disclosure.

BRIEF DESCRIPTION OF THE DRAWINGS

FIG. 3A shows a plot of the carbon monoxide concentration [CO] during the various steps of the crystal pulling operation; it also points out surface area $$S = \int_o^t [CO]dt.$$

FIGS. 3B and 3C show respectively the graph of surface area S, and carbon content in silicon $[C]_{si}$ as a function of the time t during the pulling operation.

FIG. 3D shows the graph of surface area S versus the carbon content $[C]_{si}$ during the pulling operation.

FIG. 4 shows the conventional crystal puller of FIG. 1 after modification, including the monitoring set-up and said special design of the graphite crucible, according to the present invention.

DESCRIPTION OF THE PREFERRED EMBODIMENT

The interaction of oxygen and carbon monoxide in the gas phase of a crystal puller is important to this invention. From simple gas kinetics theory, we know that the number of particles striking a unit area per unit time, dN/dt, is given by:

$$dN/dt = \tfrac{1}{4}\bar{n}\cdot\bar{v}$$

where $\bar{n}$ is the particle density and $\bar{v}$ the average velocity.

At a given temperature, $\bar{v}$ is kept constant and $\bar{n}$ is proportional to the pressure, P. Thus, dN/dt is proportional to P.

$$dN/dt = \alpha P$$

where $\alpha$ is a proportionality constant. Then, any number, N, of particles having struck the same area within a given time interval, $\Delta t$, will be given by:

$$N = \alpha \int_{\Delta t} P\, dt$$

If we now apply the relation to our objects, it is reasonable to assume that the total amount of dissolved carbon in the silicon melt, Q, will then be related to carbon monoxide concentration by:

$$Q = \alpha \int_o^{\Delta t} [CO]dt$$

where $\Delta t$ can be written as:

$$\Delta t = t_{melt} + t_{stab} + t_{pull}$$

where $t_{melt}$ is the melting time duration starting from time $t_o$;

$t_{stab}$: duration to cool the melt down to pulling set point $t_2$;

$t_{pull}$: overall duration of crystal growth starting from said pulling set point.

FIG. 3 shows the graph of carbon monoxide concentration [CO] as a function of the total pulling duration $\Delta t$. The curve points out the different stages of the pulling operation: melting (I), stabilization (II) and pulling (III). It is interesting to note that the amount of dissolved carbon in the silicon melt, Q, is proportional to the hatched surface area S, as shown in FIG. 3A, where carbon monoxide concentration is plotted along the ordinate (y-axis) and time is plotted along the abscissa (x-axis). Surface area S is equal to the integral of carbon monoxide concentration over a period of time from $t_o$ to $t_2$;

$$S = \int_o^t [CO]dt.$$

Figure 2:
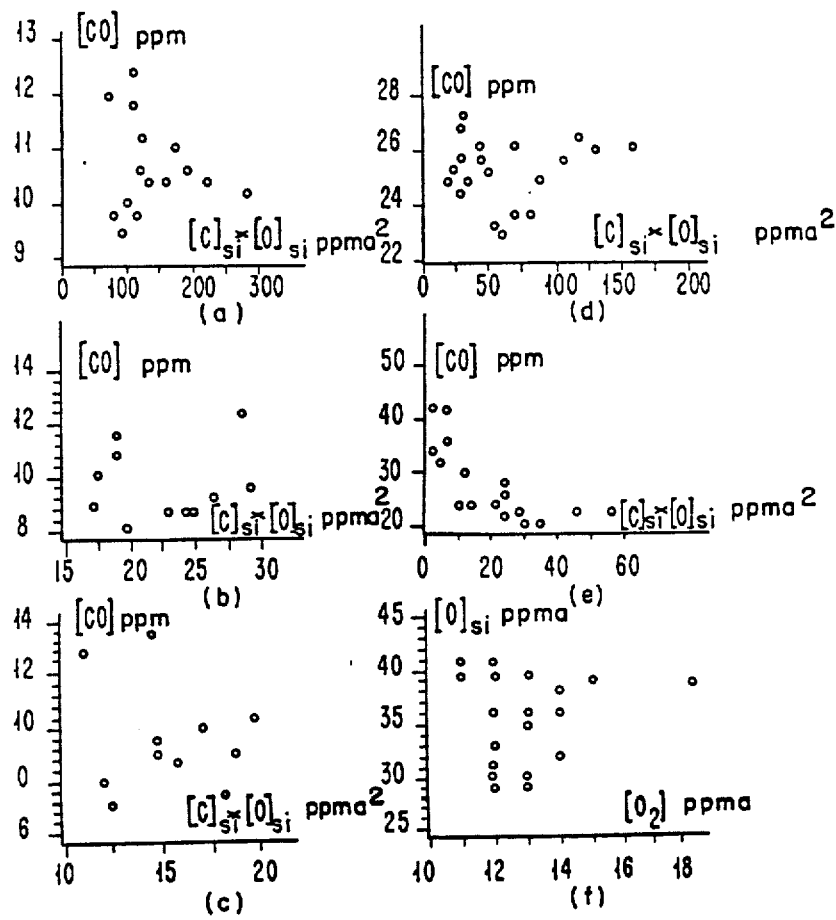
FIGS. 2A to 2E are plots showing carbon monoxide concentration [CO] versus the product of carbon content and oxygen concentration in silicon $[C]_{si} \times [O]_{si}$.
FIG. 2F is a plot showing the oxygen concentration in silicon $[O]_{si}$ versus oxygen concentration [O2], all above plots resulting from previous works.

Since carbon does not evolve from silicon melt, one can expect that the carbon content in the grown silicon crystal will be related to surface area S, as shown schematically in FIG. 3D, which is obtained from combining the graphs of FIGS. 2B and 2C.

Because the value of surface area S is mainly determined by the preliminary stages of melting and stabilization of the melt, and is only slightly modified during the pulling operation itself, as clearly demonstrated by FIG. 3D; the preliminary stages, and in particular the initial carbon monoxide concentration $[CO]_o$, is of key importance. The present invention is based on this observation, and controlled amounts of carbon will be introduced in the silicon crystal during its growth through the monitoring of carbon monoxide concentration in the puller atmosphere from $t_o$ to $t_2$.

According to the invention, a controlled amount of oxygen, or air, is introduced in the puller atmosphere only during the melting step. This oxygen is then converted into carbon monoxide via reactions (4) and (5) with hot graphite parts. The melting step is the most favorable time for incorporating carbon into the silicon melt for several reasons. As a matter of fact, during the melting of the polycrystalline load, the power provided to the heating resistor is maximum, and therefore the graphite heater temperature is the highest, enhancing reactions (4) and (5). There is, therefore, a maximum generation of CO in the chamber. On the other hand, for reasons previously given, it is not recommended to enhance CO generation during crystal growth. CO pressure is continuously recorded and the corresponding electronic output can be used to control the amount of oxygen introduced. Also, use of the same electronic output enables prediction of carbon content profile in the crystal. It also enables detection of any departure from given points of a crystal puller, and then the taking of corrective action to eliminate or minimize loss of defective substrate, say substrates with carbon content not in the specified range.

Figure 1:
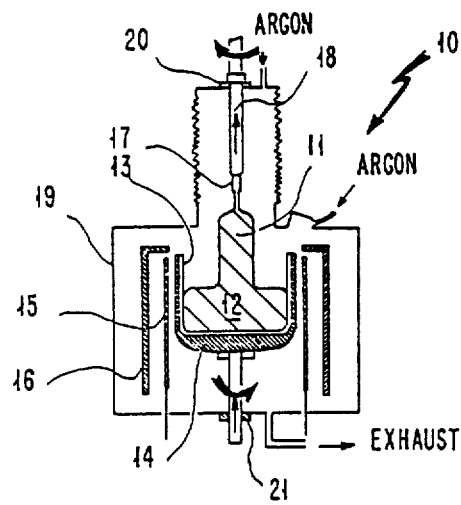
FIG. 1 shows a schematical cross sectional view of a conventional crystal puller of the atmospheric pressure type.

FIG. 4 shows the improved puller of the present invention, which the conventional puller of FIG. 1 has been modified according to the teachings of the present invention, the same elements bearing the same references.

The main change in the puller, consists of the addition of a means for the controlled introduction of an oxygen-containing gas during the melting step, and a monitoring set-up 25 to determine surface area S through the continuous determination of carbon monoxide concentration [CO] over time. According to a first embodiment, the said means includes port 22, valve 23 and feeding pipe 24, connected to an oxygen source (not represented). There are other ways of introducing oxygen.

According to another embodiment, the hermetic seals, 20 and 21, are removed and a controlled amount of air is simply introduced by applying an argon depression. This depression may result from backstream, depending on chamber pressure with respect to ambient. The depression controls oxygen leakage into the chamber because as argon is introduced into the chamber, argon also leaks out. As the argon leaks out, a localized pressure depression causes backstreaming in the areas of the leakage, which allows oxygen or air from the ambient to leak in.

The monitoring set-up 25 will now be described in detail. It is comprised of a means for extracting carbon monoxide from the chamber and integrating means to determine surface area S. Extracting means includes a gas sample outlet 26, located on the top plate just above the melt and a rockwool filter 27. The sample outlet location is of prime importance for the validity of the results. It is reasonable to admit that not all the total amount of carbon monoxide, produced in the chamber, will be trapped by the silicon melt, since the flow of argon drives both SiO and CO away from the melt. For instance, measurements performed at the argon exhaust indicated [CO] values up to 150 to 200 ppm during crystal growth, compared with 20 ppm near the melt. The rockwool filter 27, is used to trap silicon monoxide particles, so that, at the output of the filter, only carbon monoxide will be present.

The integrating means includes an analyzer 28 for measuring [CO] concentration. Carbon monoxide concentration is measured by IR absorption, for example, with a Cosma diamant 6000 model analyzer. Before each measurement, the analyzer is calibrated with a reference gas through valve 29. A direct recording diagram is made available on a graphic plotter and, meanwhile, the output signal is recorded on a computer tape, and further electronically corrected for baseline drift.

Figure 5:
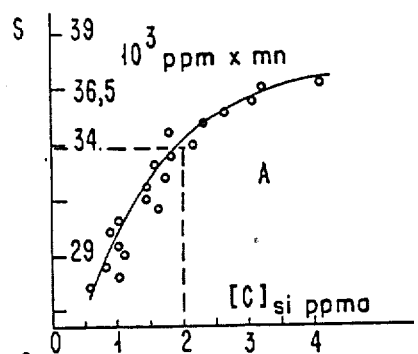
FIG. 5 shows a plot depicting surface area (S) as a function of carbon content in a grown silicon crystal $[C]_{si}$ for a first experiment.
Figure 6:
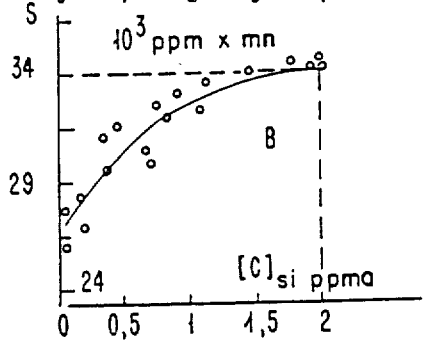
FIG. 6 shows a graph depicting surface area (S) as a function of carbon content in a grown silicon crystal $[C]_{si}$ for another experiment.

Experimental results comparing conventional pullers (i.e. FIG. 1) to the improved puller (i.e. FIG. 4) of this invention are as follows: 82.5 mm diameter crystals have been first pulled with two different conventional pullers, referenced A and B. The carbon concentration was recorded during the melting operation as shown in FIGS. 5 and 6 for pullers A and B respectfully. Then with the improved equipment of FIG. 4., [CO] concentration was recorded on a point to point basis during the melting operation and continuously thereafter. Starting from seed, cone wafers were sliced at 0.5 inch (13 mm) steps, corresponding to 10 minutes intervals of pulling time. The corresponding [CO] concentration values were selected, providing unambiguous coincidence between a given [CO] concentration value and carbon and oxygen concentrations in the crystal, as measured thru FTIR (Fourier Transform Infra Red) spectrophotometer. Concentrations of oxygen and carbon are given on the basis of ASTM standards F 121-1979 and F 123-1976 respectively.

The typical results plotted in FIGS. 5 and 6 for standard pullers A and B respectively, occur when no oxygen is introduced during the melting step. A good correlation is pointed out between surface area S in ppm min. and $[C]_{Si}$ in ppma. It is to be pointed out that plots of FIGS. 5 and 6 indicate a good agreement of numerical values. For example, with both pullers A and B, with $S = 34 \times 10^3$ ppm min., the carbon content in the silicon crystal is about 2 ppma. In both cases, the S versus $[C]_{Si}$ curve is not linear due to the segregation coefficient of carbon.

Figure 7:
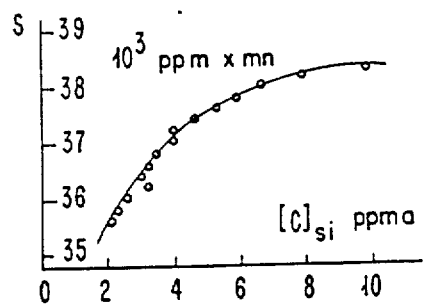
FIG. 7 shows still another plot depicting surface area (S) as a function of carbon content in a grown silicon crystal $[C]_{si}$ in an experiment where silicon crystals with high carbon content were desired.

FIG. 7 shows the same S versus $[C]_{Si}$ plot, with the improved equipment, when air has been introduced during melting to achieve a [CO] level of 800 ppm, turning to a normal 15 ppm level during crystal growth. Higher values of $[C]_{Si}$ are noticed starting from 2 ppma at the seed end portion of the crystal, ending at values near solubility limit at the tail end (about 10 ppma).

These results were obtained under the following experimental conditions:

| | |
|---|---|
| pressure in the puller at melting start time | 3 mm water above ambient |
| argon flow | 150 cc/min |
| target S surface area (as defined above) | $38 \times 10^3$ ppm $\times$ min |
| depression amplitude below ambient | −5mm water |
| duration of depression | 2 min. |
| recover time of initial [CO] level (≃ 30 ppma) | 15 min. |
| total duration of melting operation | 90 min. |
| total duration of stabilization operation | 30 min. |
| total duration of pulling operation | 9 hours |
| crystal diameter | 82 mm |
| crystal length | 50 cm |
| silicon melt weight (load) | 9 kg |

A lower level of $[C]_{Si}$ could be obtained by reducing the puller pressure below ambient for a shorter time. The surface area S and therefore $[C]_{Si}$ values would become consequently smaller. Thus, the desired $[C]_{Si}$ level could be controlled in situ in real time by adjusting the carbon monoxide concentration over time through appropriate settings of the two key parameters: depression amplitude and duration of depression among those mentioned above.

FIG. 7 shows that if high carbon content silicon crystal are required, for example, 4 ppma$\leq[C]_{si}\leq$10 ppma, surface area S should be at least equal to $37\times10^3$ ppm min. The dominating factor will be $[CO]_o$ in ppm as explained above (in conjunction with FIGS. 2a to 2f). If the puller equipment of FIG. 4 is manually operated, the operator knows normal values for $t_{melt}$, $t_{stab}$ and $t_{pull}$, depending the results displayed by the analyzer, he will adjust the argon depression to reach the desired $[CO]_o$ level appropriate to achieve the desired S value. Alternatively, an automatic feedback loop can be implemented to adjust the required amount of oxygen introduced by either adjusting the argon depression or by directly introducting the oxygen.

This again demonstrates that simply recording the [CO] concentration value during crystal growth will not reflect the actual carbon concentration in the crystal, since a steady level in the 15 to 20 ppm range was observed during growth of either low or high carbon containing crystals. This invention has the added advantage of being able to be implemented without making major alterations on the structure of a conventional puller. By utilizing this invention, it is possible to adjust the oxygen concentration profile on the crystal by employing techniques such as described in U.S. Pat. No. 4,417,943 (IBM) for instance, to definitely meet the desired range of carbon content coupled with the desired range of oxygen concentration, necessary for gettering purposes with no loss of substrates.

Figure 8:
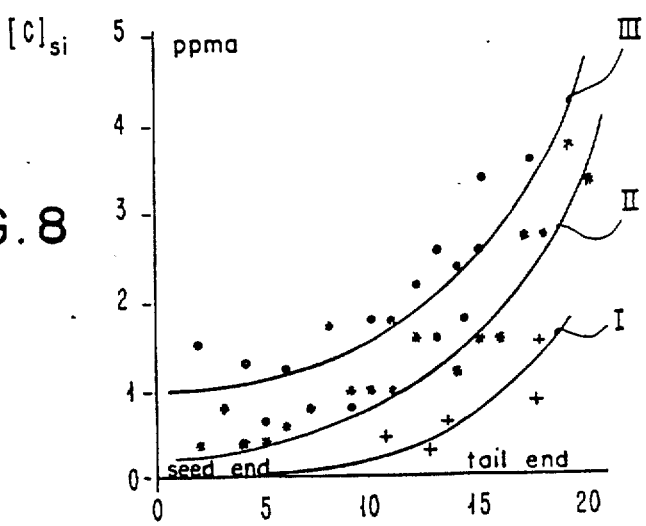
FIG. 8 shows various plots depicting the carbon content in a grown silicon crystal $[C]_{si}$ as a function of the location in the rod, when different design changes are implemented in the crystal puller.

Graphite package geometry may also be arranged in such a way as to adjust, and in particular, to increase the graphite-oxygen exchange area near the melt, where CO is most likely to be trapped. Experiments have shown that to be effective, the design change to the package geometry must take place at the vicinity of the melt interface. Silica quartz crucible 13 has 1 cm cut in height with respect to the crucible holder 14 to expose the upper part of it and so the available exchange area for oxygen reaction with graphite parts was enlarged. This design change has been introduced in the equipment as shown in FIG. 4. However, such a configuration, by itself does not provide reproducible results, as it will be shown in FIG. 8. Turning now to FIG. 8, curve I represents the carbon content in silicon crystal $[C]_{si}$ as a function of the location in the crystal rod seed to tail, for a crystal grown with the conventional puller equipment shown in FIG. 1. With the same equipment, two crystals have been grown with the above described design change. Curves II and III demonstrates there is a significant increase in the carbon content in the grown crystals. However, one can see that for the same apparent process condition, the carbon concentration profiles for the two silicon crystals are somewhat dispersed and therefore the design change could not be used alone without the controllable introduction of oxygen in an industrial manufacturing environment.

Czochralski pullers after having been modified according to the teachings of the present invention, appear to be flexible tools to produce silicon crystals with high and controlled carbon content. Simple action on chamber pressure, along with a monitoring of carbon monoxide partial pressure, result in a fully controlled process.

While that which has been shown and described is considered at present to be the preferred embodiment of the present invention, it will be appreciated by those skilled in the art, that modifications of such embodiment may be made. It is therefore desired that the invention not be limited to this embodiment, and it is intended to cover in the appended claims all such modifications as fall within the true spirit and scope of the invention.

What is claimed is:

1. An improved Czochralski crystal growth process for growing crystals having carbon content that varies during the length of the crystal growth period, comprising the steps of:
   introducing oxygen into a crystal puller only during the melting step of said Czochralski crystal growth process; and
   monitoring the carbon monoxide concentration in the crystal puller during the pulling step while not controlling the oxygen or carbon monoxide concentration during this step.

2. The method of claim 1 further comprising the step of adjusting the amount of oxygen introduced into said crystal puller during said melting step as a function of the carbon monoxide concentration monitored during said pulling step, so that the carbon content in said crystals is controlled.

* * * * *

UNITED STATES PATENT AND TRADEMARK OFFICE
CERTIFICATE OF CORRECTION

PATENT NO. : 4,705,591

DATED : November 10, 1987

INVENTOR(S) : Jean-Francois Carle and Patrick Phillippot

It is certified that error appears in the above-identified patent and that said Letters Patent is hereby corrected as shown below:

Column 1, line 15 — Delete "im" and insert therefor --in--

Column 2, line 10 — Delete "$Cs+O2_g \rightarrow CO/112_g$" and insert therefor --$Cs+O2_g \rightarrow CO2_g$--.

Column 4, line 55 — Delete "$[O/11]_{si}$" and insert therefor --$[O]_{si}$--.

Column 7, line 48 — Delete "$dN/dt=1/4\ n.v$" and insert therefor --$dN/dt=1/4\ \bar{n}.\bar{v}$--.

Column 11, line 4 — Delete "$4\ ppma \leq [C]_{si} \leq 10$" and insert therefor --$4\ ppma \leq [C]_{si} \leq 10$--.

Signed and Sealed this

Fifth Day of July, 1988

Attest:

*Attesting Officer*

DONALD J. QUIGG

*Commissioner of Patents and Trademarks*